United States Patent
Ali et al.

(10) Patent No.: US 10,914,636 B2
(45) Date of Patent: Feb. 9, 2021

(54) THERMOPILE SELF-TEST AND/OR SELF-CALIBRATION

(71) Applicant: AMS Sensors UK Limited, Cambridge (GB)

(72) Inventors: Syed Zeeshan Ali, Cambridge (GB); Kaspars Ledins, Cambridge (GB)

(73) Assignee: AMS SENSORS UK LIMITED, Cambridge (GB)

( * ) Notice: Subject to any disclaimer, the term of this patent is extended or adjusted under 35 U.S.C. 154(b) by 204 days.

(21) Appl. No.: 15/923,670

(22) Filed: Mar. 16, 2018

(65) Prior Publication Data

US 2019/0285478 A1   Sep. 19, 2019

(51) Int. Cl.
| | |
|---|---|
| *G01J 5/12* | (2006.01) |
| *G01R 31/26* | (2020.01) |
| *G01J 5/02* | (2006.01) |
| *G01J 5/14* | (2006.01) |
| *H01L 35/34* | (2006.01) |
| *G01J 5/00* | (2006.01) |

(52) U.S. Cl.
CPC .............. *G01J 5/12* (2013.01); *G01J 5/026* (2013.01); *G01J 5/14* (2013.01); *G01R 31/2637* (2013.01); *H01L 35/34* (2013.01); *G01J 2005/0048* (2013.01)

(58) Field of Classification Search
None
See application file for complete search history.

(56) References Cited

U.S. PATENT DOCUMENTS

| | | | |
|---|---|---|---|
| 2,366,618 A * | 1/1945 | Harrison ............ | G05D 23/2237 236/74 R |
| 4,571,689 A | 2/1986 | Hildebrand et al. | |
| 5,469,070 A * | 11/1995 | Koluvek ................ | G01R 27/14 204/412 |
| 6,046,398 A | 4/2000 | Foote | |
| 6,239,351 B1 | 5/2001 | Hall, Jr. | |
| 6,294,787 B1 | 9/2001 | Schieferdecker et al. | |
| 7,785,002 B2 | 8/2010 | Dewes et al. | |
| 9,222,844 B2 * | 12/2015 | Rud ......................... | G01K 7/20 |
| 9,929,333 B1 * | 3/2018 | Emadi ..................... | H01L 35/32 |
| 2008/0317087 A1 | 12/2008 | Kimura | |
| 2010/0309947 A1 * | 12/2010 | Parasnis ............ | A61B 5/14532 374/1 |

(Continued)

FOREIGN PATENT DOCUMENTS

EP    1333504 A2    8/2003

OTHER PUBLICATIONS

Schneeberger, N., et al., "Optimized CMOS Infrared Detector Microsystems", IEEE (1995), Physical Electronics Laboratory, pp. 198-201.

(Continued)

*Primary Examiner* — Paresh Patel
(74) *Attorney, Agent, or Firm* — Tucker Ellis LLP

(57) ABSTRACT

We disclose herein a method for testing and/or calibrating a thermopile based device. The method comprising: applying an electrical bias of a first polarity to the thermopile based device and measuring a first value of an electrical parameter; and applying an electrical bias of a second polarity to the thermopile based device and measuring a second value of an electrical parameter.

17 Claims, 6 Drawing Sheets

(56) References Cited

U.S. PATENT DOCUMENTS

2011/0245713 A1* 10/2011 Rensen ............... G01K 3/14
                                                        600/549
2013/0029851 A1*  1/2013 Esfandyarpour .. G01N 25/4806
                                                        506/2

OTHER PUBLICATIONS

Nieveld, G.D., "Thermopiles Fabricated using Silicon Planar Technology", Sensors and Actuators, 3 (1982/83), pp. 179-183.

Allison, S.C., et al. "A bulk micormachined silicon thermopile with high sensitivity", Sensors and Actuators A 104 (2003), pp. 32-39.

Lahiji, G.R. and Kensall, a Wise, "A Batch-Fabricated Silicon Thermopile Infrared Detector", IEEE (1982), Vol, ED-29, No. 1, pp. 14-22.

Lenggenhager, René, et al., "Thermoelectric Infrared Sensors by CMOS Technology", IEEE (1992), vol. 13, No. 9, pp. 454-456.

Graf, A., et al., "Review of micromachined thermopiles for infrared detection", Measurement Science and Technology 18 (2007) R59-R75, IOP Publishing.

Charlot, Benoît, et al., "Generation of Electrically Induced Stimuli for MEMS self-test", TIMS Lab. Research Reports, 14 pages, undated.

Charlot, Benoît, et al., "A Self-testable CMOS Thermopile-based Infrared Imager", TIMA Laboratory, Proceedings of SPIE vol. 4408 (2001), 9 pages.

Oliver, Andrew D., Wise, Kensall D., "A 1024-element bulk-micromachined thermopile infrared imaging array", Sensors and Actuators 73 (1999), pp. 222-231.

Barry, Tim et al., "Self-Calibrating Infrared Thermometer for Low-Temperature Measurement", IEEE (2011) vol. 60, No. 6, pp. 2047-2052.

Mancarella, Fulvio et al., "Wafer-level testing of thermopile IR detectors", IEEE (2005), pp. 1133-1136.

International Search Report and Written Opinion from corresponding International Patent Application No. PCT/GB2019/050709, dated Jul. 8, 2019, 17 pages.

* cited by examiner

THERMOPILE SELF-TEST AND/OR SELF-CALIBRATION

TECHNICAL FIELD OF THE DISCLOSURE

This disclosure relates to testing and/or calibration of thermopile based devices, particularly but not exclusively, to testing and/or calibrating thermopile based IR detectors.

BACKGROUND OF THE DISCLOSURE

It has been demonstrated to make IR detectors based on thermopiles, especially in silicon technology. For Example, Schneeberger et. al "Optimized CMOS Infrared Detector Microsystems," Proc IEEE Tencon 1995, reports fabrication of CMOS IR detectors based on thermopiles. The thermopile includes several thermocouples connected in series. KOH (potassium hydroxide) is used to etch the membrane and improve the thermal isolation. Each thermocouple includes 2 strips of different materials, connected electrically and forming a thermal junction at one end (termed hot junction) while the other ends of the material are electrically connected to other thermocouples in series forming a thermal cold junction. The hot junctions of the thermocouples are on the membrane, while the cold junction is outside the membrane. Three different designs of the thermocouples are given in the paper with different material compositions: Aluminium and p-doped polysilicon, Aluminium and n-doped Polysilicon, or p-doped polysilicon and n-doped polysilicon. Incident IR radiation causes a slight increase in temperature of the membrane. The Seebeck effect causes a slight voltage difference across each thermocouple—resulting in a much large increase in voltage difference across the thermopile which is the sum of the voltages across each thermocouple.

Previously, Nieveld "Thermopiles Fabricated using Silicon Planar Technology," Sensors and Actuators 3 (1982/83) 179-183, showed the fabrication of a thermopile on a micro-chip based on aluminium and single crystal silicon P+ as the materials in the thermocouple. This relates to a general thermopile device which is not intended for IR detection, and the thermopile of the device is not on a membrane.

Allison et. al, "A bulk micromachined silicon thermopile with high sensitivity," Sensors and Actuators A 104 2003 32-39, relates to a thermopile based on single crystal silicon P-doped and N-doped materials. However, these are formed by waferbonding of a P-type wafer and an N-type wafer and are also not specifically for use as an IR detector. The fabrication method is also very expensive.

Lahiji et. al., "A Batch-fabricated Silicon Thermopile Infrared Detector," IEEE Transactions on Electron Devices" 1992, describe two thermopile IR detectors, one based on Bismuth-antimony thermocouples, and the other based on polysilicon and gold thermocouples.

U.S. Pat. No. 7,785,002 describes an IR detector with a thermopile based on P and N doped polysilicon. Langgenhager "Thermoelectric Infrared Sensors by CMOS Technology," IEEE EDL 1992, describes IR detectors consisting of thermopiles on a suspended structure including aluminium and polysilicon.

Several other thermopile devices are described by Graf et. al. "Review of micromachined thermopiles for infrared detection," Meas. Sci. Technol. 2007.

Infrared devices need to be tested, to check if the sensitivity falls within the device specifications. This can be in application, for the device to self-test, or self-calibrate. The testing can also be during production, at either wafer level or at package level.

It is well known to test an infrared device by exposing the device to a known quantity of IR radiation, and measuring the device's response. However, testing during production using this method is expensive to setup and measure. This is due to the increased handling time needed to move each device to the test socket for IR exposure.

Additionally, in application, it may not be possible to expose the device to a known radiation source. For example, in an NDIR (Non Dispersive Infra Red) device, an IR emitter is coupled to an IR detector, and the IR radiation reaching the detector is reduced in the presence of target gas. If using the IR emitter to self-test/self-calibrate, any gas present would reduce the amount of IR radiation reaching the detector, and hence not allow a proper test/calibration.

It is also known to self-test thermopiles. Typically this includes a heater on the same membrane structure as the thermopile (or thermally connected to the thermopile). The heater is heated, and the signal on the thermopile is used to self-test or self-calibrate the device. Such a method is used by B. Charlot et. al, "Generation of Electrically induced Stimuli for MEMS Self-Test," Journal of Electronic Testing, Vol 17, issue 6, pp 459-470, and also by U.S. Pat. No. 6,294,787 and US2008/0317087.

B. Charlot et. al., "Self-testable CMOS thermopile-based infrared imager", Proceedings of SPIE, volume 4408, pp 96-103, and A. Oliver, K. Wse, "A 1024-element bulk-micromachined thermopile infrared imaging array," Sensors and Actuators vol 73, pp 222-231, 1999, use the method to self-test pixels in an array of thermopiles, with each thermopile pixel having its own heater.

T. Barry et. al, "Self-Calibrating Infrared Thermometer for Low-Temperature Measurement," IEEE Transactions on Instrumentation and Measurement, Vol 60, No. 6, pp 2047-2052 June 2011, and U.S. Pat. No. 6,239,351 use a similar method, but for larger (Not MEMS) devices.

F. Mancarella et. al, "Wafer-level testing of thermopile IR detectors," Proceeding of IEEE Sensor 2005, pp 1133-1136, uses the same method for wafer level testing and for calibration of the devices.

U.S. Pat. No. 4,571,689 tests a single thermocouple. In this method, a first thermocouple causes a heating in a second thermocouple and this is measured to test the second thermocouple.

Embedding an additional heater means that there are additional tracks on the membrane, which reduce the thermal isolation of the thermopile, and thereby reduce its sensitivity. Furthermore, to make space for the heater, the thermopile has to be designed in a sub-optimal manner.

As discussed above, the conventional method for self-test or self-calibration is to have a heater in the same membrane as the thermopile. The heater is used to heat up the membrane, and the resulting signal on the thermopile is used to test or calibrate the device.

In summary, the conventional method has several disadvantages:
  i) Having a heater embedded in the membrane means there are additional tracks embedded within the membrane, that act as a path for heat loss. This reduces the sensitivity of the thermopile IR detector.
  ii) The heater within the membrane takes up space. This means that the thermopile is modified from the optimum thermopile design in order to make space for the heater. This modification from the optimum design can result in lower sensitivity. Alternately, if extra layers are put on for the heater, this increases the device cost, and also increases heat loss, resulting in lower sensitivity.

iii) For a thermopile IR detector chip without integrated circuitry, the heater also increases the number of bond pads required.

iv) For the application designer, this method works only if the thermopile being used already has a heater embedded in it. If a thermopile is being used that doesn't have an embedded heater, there is no way to self-test/self-calibrate, except by switching to some other thermopile. As of now most discrete thermopile IR detectors sold are without an embedded heater.

Testing or calibration is also conducted during production, during wafer sort and as a final test.

During wafer sort, it is not possible to control the amount of IR radiation that the sensor is exposed to, so the only possible testing or calibration method is electrical, using a heater embedded within the membrane.

During final test, each packaged device can be exposed to IR radiation to test/calibrate the device. However, this method has a longer test time, resulting in high test costs. It also has a higher setup cost.

SUMMARY OF THE DISCLOSURE

By using an electrical test method on just the thermopile itself, without the need for an additional heater, this disclosure overcomes all the above disadvantages.

Generally speaking, the disclosure relates to infrared detectors. Infrared detectors are often based on thermopiles fabricated in silicon technology. These typically comprise a number of thermocouples embedded within a dielectric membrane supported by a semiconductor substrate. The substrate below the membrane is generally etched, which thermally isolates the membrane. The thermocouples comprise two dissimilar materials, and have a hot junction (within the membrane area), and a cold junction (outside the membrane area). The thermocouples are connected together in series to form a thermopile.

When IR radiation falls on the membrane, it is absorbed and slightly increases the membrane temperature. This results in a small voltage across each thermocouple, and is added together to give a voltage across the thermopile. This voltage value gives an indication of the amount of IR radiation falling on the membrane.

Infrared devices need to be tested, to check if the sensitivity falls within the device specifications. It is desirable that the test method is an electrical test method on just the thermopile itself (of a thermopile based device), without the need for an additional heater.

As noted above, in this disclosure, the functionality and sensitivity of the thermopile detector is tested using electrical methods without the need to expose it to IR radiation.

According to one aspect of the present disclosure, there is provided a method for testing and/or calibrating a thermopile based device. The method comprising: applying an electrical bias of a first polarity to the thermopile based device and measuring a first value of an electrical parameter; and applying an electrical bias of a second polarity to the thermopile based device and measuring a second value of an electrical parameter.

The electrical bias of the first polarity and the electrical bias of the second polarity are applied to at least one thermopile of the thermopile based device.

The electrical parameter measured may be a corresponding electrical parameter resulting from the applied electrical bias.

The electrical bias of a first polarity and the electrical bias of a second polarity may be the same type of electrical bias. The first value of an electrical parameter and the second value of an electrical parameter may be values of the same electrical parameter.

Alternatively, the electrical bias of a first polarity and the electrical bias of a second polarity may be different types of electrical bias. The first value of an electrical parameter and the second value of an electrical parameter may be values of different electrical parameters.

The method may further comprise using the first value and the second value to determine whether the device is functioning correctly.

The method may further comprise using the first value and the second value to determine a third value for calibration of the thermopile device.

Optionally, the first polarity and the second polarity may be opposite polarities.

This disclosure proposes a method to test most of the functionality of the thermopile based device or infrared detector without the need to expose the device to IR radiation or the need of a separate heater.

Compared to state-of-the-art testing and calibrating methods, the method disclosed herein overcomes the above discussed problems. The proposed method disclosed has the following advantages:

i) This method works on any infrared detector, as there is no requirement for an embedded heater or the detector being connected to a heater. As of now most discrete thermopile IR detectors sold are without an embedded heater.

ii) As there is no requirement for a heater to be embedded in the membrane, no additional tracks are used within the membrane, therefore reducing heat loss. The infrared detector has a high sensitivity than a detector with an embedded heater and additional tracks.

iii) Since no extra heater is needed, there is no limitation on the design of the heater. The detector can have a higher sensitivity than one also designed to include a heater.

iv) Furthermore, the membrane does not have to include extra layers for the heater. This means the detector has a reduced cost, lower heat loss, and higher sensitivity.

v) The IR detector chip does not have to be connected to a heater. This reduces the number of bond pads required.

Advantageously, during wafer sort, electrical testing and calibration can be carried out without exposing the detector to IR radiation and controlling the amount of IR radiation that the sensor is exposed to.

During final package level test, exposing each packaged device to IR radiation to test/calibrate the device increases test time and increasing test and setup costs. The disclosed method of testing and calibrating therefore has shorter test time, and lower test and setup costs.

The disclosed technique can be applied to IR sensor modules having the test circuitry integrated on the same chip or same package. It can also apply to applications of IR detectors, such as NDIR sensors, IR spectroscopy, remote temperature sensors, or IR detector arrays for people counting. Such devices have potential applications in home and building automation, industrial/lab application, and mobile devices.

The method may further comprise:
  determining the magnitudes of the first value and the second value;
  calculating a value of the absolute difference between the magnitude of the first value and the magnitude of the second value.

The method may further comprise determining whether the value of the absolute difference is greater than a predetermined threshold value. Advantageously, this may determine whether the device is functioning correctly or not.

Optionally the method may further comprise storing the value of the absolute difference.

The absolute difference between the magnitude of the first value and the magnitude of the second value may be based on the voltage generated in the thermopile due to heating after the voltage generated from the resistance of the material of the thermopile is cancelled out. The voltage generated from the resistance of the material may be the voltage generated due to Ohm's law.

Preferably, the electrical bias of the first polarity and the electrical bias of the second polarity may have a substantially equal magnitude. Here the term substantially equal means almost or nearly equal.

Optionally, applying the electrical bias of the first polarity to the infrared detector and applying the electrical bias of the second polarity to the infrared detector may comprise applying an electrical current to the thermopile device.

The first and second electrical bias applied may be predetermined, for example a fixed voltage or current. Alternately, the applied bias maybe determined during testing, for example adjusting the current or voltage to reach a target power value. It is also possible that the second electrical bias is determined based on the measurements results of the first electrical bias.

Measuring the first value and measuring the second value may comprise measuring the voltage across the thermopile device.

In summary, the method may comprise:
1. Applying a current to the thermopile and measuring the voltage across it
2. Applying a current to the thermopile with the opposite polarity, and measuring the voltage.
3. Using the difference in the electrical characteristics measured in steps above to determine if the device is functioning and/or to calibrate the device.

Preferably, the currents used in both directions may be identical in amplitude. However, they can be different, for example the current can be dynamically set to be the same power level in each direction.

Alternately, they can be set so as to have the same voltage, while the difference in currents may be used to determine if the device is functioning and/or calibrate the device. The desirable feature for the disclosure is that two electrical biases of opposite polarities are applied.

Generally speaking, this proposed technique/method works as when current is applied:
a) A voltage is generated across the thermopile due to Ohm's law. This voltage is proportional to the thermopile resistance and is dependent on the polarity of the current applied.
b) The current going through the thermopile slightly heats the membrane, and generates a further voltage across the thermopile. This voltage is always +ve at the +ve terminal of the thermopile, and −ve at the −ve terminal of the thermopile. This voltage is therefore independent of the polarity of current applied.

Preferably, the amplitude of the currents may be identical in both polarities, and the difference in the absolute voltages measured in steps 1 and 2 is used to determine if the device is functioning and/or to calibrate the device.

Advantageously, when the current is applied flowing from the +ve terminal to the −ve terminal (a first polarity), then the two voltages due to Ohm's law and due to thermopile heating add up. When the current is applied in the opposite direction, then the voltages due to Ohm's law and due to thermopile heating subtract from each other.

When the difference of the absolute voltages is taken, the voltage generated by Ohm's law is cancelled out (as this is equal in magnitude for both polarities of current applied), as well as any parasitic effects of the circuit, leaving only the voltage generated in the thermopile due to the heating of the membrane.

The heating of the membrane and the difference in absolute voltages is affected by:
  The Seebeck coefficient of the thermopile materials. (The Seebeck coefficient determines the voltage across the thermopile materials per temperature difference across the material)
  The materials and thicknesses of the thermopile materials and the dielectric layers
  Whether the substrate below is etched or not.
  If there is any air or gas above and below the membrane.

All these factors affect the sensitivity of the thermopile. As such this method can be used to test and/or calibrate the device in application, or during production testing.

Applying the electrical bias of the first polarity may be achieved by directing a first current from a positive terminal to a negative terminal of the thermopile based device; and applying the electrical bias of the second polarity may be achieved by directing a second current from the negative terminal to the positive terminal of the thermopile based device. The method may further comprise electrically connecting at least two thermopile devices and testing and/or calibrating the at least two thermopile devices simultaneously.

Advantageously, the method may further comprise applying an electrical bias of zero magnitude to the thermopile device and measuring a value of an electrical parameter, in addition to the first and second values, to determine the functionality of the device and/or the calibration the device. In other words, performing an additional measurement of an electrical parameter without applying an electrical bias on the thermopile can be used to measure the background signal on the thermopile.

The method may further comprise, after testing, storing a calibration value on the thermopile chip, or a chip in the same package as the thermopile According to a further aspect of the present disclosure, there is provided a system for testing and/or calibrating a thermopile based device, the system comprising:
  the thermopile based device;
  a first apparatus configured to apply an electrical bias of a first polarity to the thermopile based device and to apply an electrical bias of a second polarity to the thermopile based device; and
  a second apparatus configured to measure an electrical parameter of the thermopile based device.

Preferably, the second apparatus may be configured to use the first value and the second value to determine whether the device is functioning correctly; and/or the second apparatus may be configured to use the first value and the second value to determine a third value for calibration of the thermopile device.

The first apparatus may be configured to apply the electrical bias of the first polarity by directing a first current from a positive terminal to a negative terminal of the thermopile based device; and the first apparatus may be configured to apply the electrical bias of the second polarity by directing a second current from the negative terminal to the positive terminal of the thermopile based device.

The first apparatus may comprise a plurality of transistors in which a first transistor and a fourth transistor are switched on to direct the first current from the positive terminal to the negative terminal of the thermopile device, and a second transistor and a third transistor are switched on to direct the second current from the negative terminal to the positive terminal of the thermopile based device.

Optionally, the thermopile based device and the first and second apparatus may be formed on a single chip.

Alternatively the thermopile based device and the first and second apparatus may be formed on separate chips within a single package.

The method may be used for thermopile IR detectors fabricated on a micro-chip. The thermopile may be on a thin membrane supported by a semiconductor substrate. The chip may also have any of the following:
  circuitry,
  temperature sensor,
  coating on the membrane to improve IR absorption,
  plasmonic structures on or within the membrane to improve IR absorption,
  an IR emitter on the same chip,
  an array of thermopile IR detectors.

An entire array of thermopile devices may be on a single membrane, or each thermopile may have its own membrane, or a combination. The circuitry for the self-test/calibration may be within the same chip as the thermopile. Alternately it can be on a different chip, but within the same package. Alternatively, it may be external to the package, implemented by either discrete components or a specific designed chip.

The system may further comprise an array of thermopile based devices on a single chip, wherein each device of the array of thermopile based devices are tested and/or calibrated individually.

The testing and/or calibration may be performed at a wafer level or at a package level during production testing.

The system may further comprise a third apparatus configured to store a calibration value after the testing and/or calibration, the third apparatus may be formed on a same chip as a thermopile device; or the third apparatus may be formed on a separate chip within a same package as the thermopile device. The third apparatus may also be external to the chip.

The method may further comprise, after testing, storing a calibration value on the thermopile chip, or a chip in the same package as the thermopile.

It has been previously demonstrated to use a separate source/heater to heat the thermopile, and measure its signal, while this disclosure uses the thermopile itself to heat it. However, when using the thermopile itself to heat the thermopile device if a current is applied, a large part of voltage measured is due to the resistance of the thermopile, and a very small part is due to the heating of the thermopile. It is therefore difficult to distinguish the thermopile signal from the voltage caused by the thermopile resistance. The resistance can also vary from device to device, making it even more difficult to determine if differences are caused by the resistance, or the device sensitivity. This is the reason that it has been demonstrated to use a separate heater. However, this disclosure solves this problem by using currents in two opposite directions to cancel out the effect of the thermopile resistance, and hence only know the variation in sensitivity.

The disclosure is distinguished from the prior art by the fact that no extra heating element is required for self-test or self-calibration of the thermopile. Thereby making the fabrication process less complicated, and allowing an optimized thermopile IR detector design with good sensitivity.

The disclosure is also distinguished from the prior art by the use of current in two opposite directions. The technique proposed in the disclosure is advantageous because without the need for the heater, the thermopile is thermally isolated in a better way, resulting in higher sensitivity. It also allows a more optimized thermopile design, without having to sacrifice space for the heater.

For a discrete device, there is no need for additional bond pads for a heater to calibrate the thermopile.

The use of two currents of different polarities results in improved measurement accuracy by cancelling out effects of resistance drift, ambient temperature changes, or parasitic characteristics in the measurement circuit.

Additionally, this method can be used by the application designer for any thermopile—the thermopile does not need to be designed specifically for this method. As a large number of thermopiles in the market are without a heater, this is an important advantage.

Further advantages are as follows:
1. Thermopiles produced using this method would have a lower test cost, hence a lower product cost, making them more competitive in the market
2. Thermopiles with this self-test/self-calibration method built in (either on the chip, or a separate chip within the same package) would allow an additional feature for the device, distinguishing it from the current available devices, without compromising on the sensitivity of the thermopile. (Known solutions would result in some reduction on the thermopile sensitivity.)
3. Any IR based sensor, such as NDIR, thermopile arrays for people counting, IR spectroscopy and remote temperature sensing would also benefit from additional self-test/self-calibration capability, allowing an extra feature without compromising on device performance.

BRIEF DESCRIPTION OF THE PREFERRED EMBODIMENTS

Some preferred embodiments of the disclosure will now be described by way of example only and with reference to the accompanying drawings, in which.

DETAILED DESCRIPTION OF THE PREFERRED EMBODIMENTS

Generally speaking, the disclosure relates to a method to test the functionality of a thermopile detector without the need to expose the device to IR radiation or the need to provide a separate heater.

Figure 1:
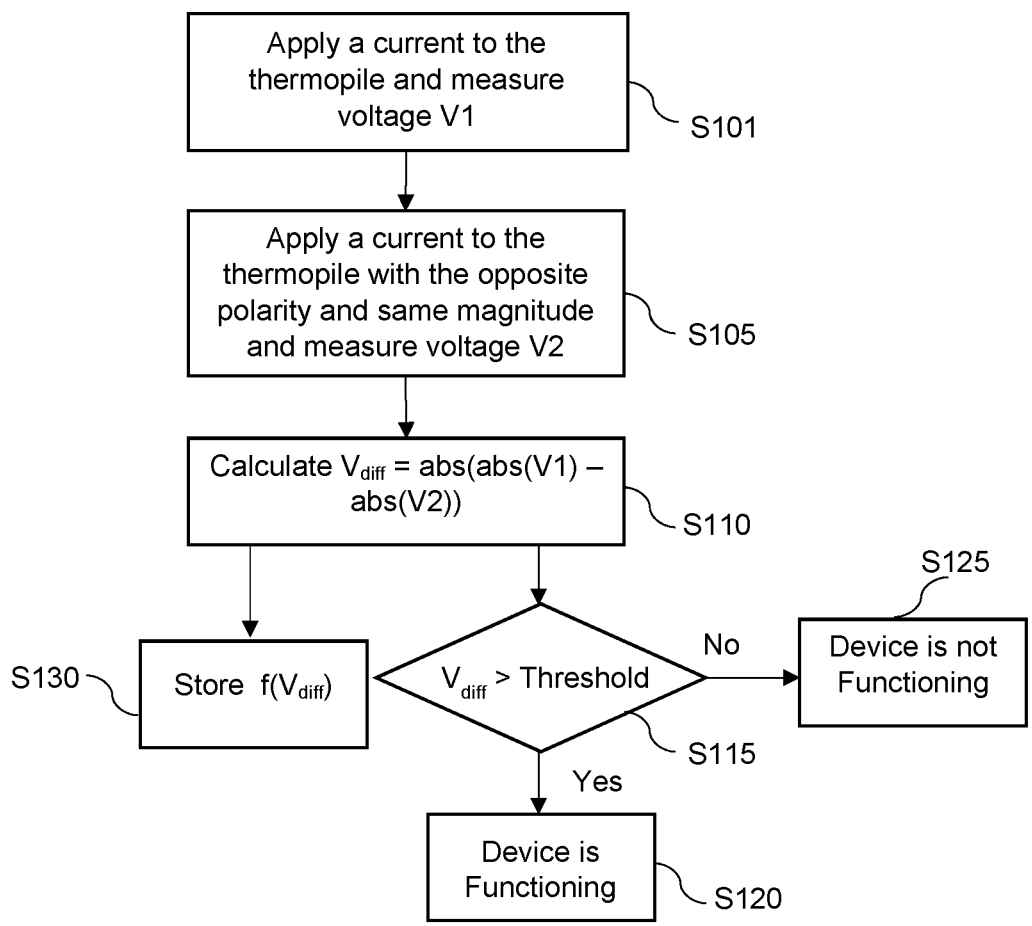
FIG. 1 illustrates a flow diagram outlining a method to either calibrate or test the functionality of a thermopile device.

FIG. 1 illustrates a flow diagram outlining the method to either calibrate or test the functionality of a thermopile detector according to one embodiment of the present disclosure. The steps are as follows:

1. In S101, apply a current of a first polarity to the thermopile of the thermopile detector and measure the voltage (V1) across the thermopile of the thermopile detector.
2. In S105, apply a current with the opposite polarity but same magnitude as in step 1 to the thermopile, and measure the voltage (V2) across the thermopile.
3. In S110, calculate the magnitude of the difference ($V_{diff}$) between the absolute values of V1 and V2, and either:
   a. In S115, compare $V_{diff}$ to a threshold value. If $V_{diff}$>threshold value, then the device is functioning (in S125). If $V_{diff}$<threshold value, then the device is not functioning (in S120); and/or
   b. In S130, store the difference ($V_{diff}$), or a value calculated from the difference to be used as a calibration value for the thermopile.

This method works because when current is applied:

i) A voltage is generated across the thermopile due to Ohms law. This voltage is dependent on the polarity of the current applied, and is proportional to the thermopile resistance, ii) The current going through the thermopile heats the membrane, therefore generating a voltage across the thermopile. This voltage is independent to the polarity of the current applied and is always +ve at the +ve terminal of the thermopile, and −ve at the −ve terminal of the thermopile.

iii) When the current is applied flowing from the +ve terminal to the −ve terminal, then the two voltages add up constructively. When the current is applied in the opposite direction, then the voltages subtract from each other.

iv) The difference between the absolute voltages is taken, this allows the voltage generated by Ohms law to be cancelled out (as this is equal in magnitude for both polarities of current applied), as well as any parasitic effects of the circuit.

v) The difference between the absolute voltages is only affected by the voltage generated in the thermopile due to the heating of the membrane.

The heating of the membrane, and the difference in absolute voltages, is affected by:

The Seebeck coefficient of the thermopile materials. (The Seebeck coefficient determines the voltage across the thermopile materials per temperature difference across the material), The materials and thicknesses of the thermopile materials and the dielectric layers, Whether the substrate has been etched, If there is any air or other gas above and below the membrane.

All these factors affect the sensitivity of the thermopile. As such this method can be used to test and/or calibrate the device in application, or during production testing.

Figure 2:
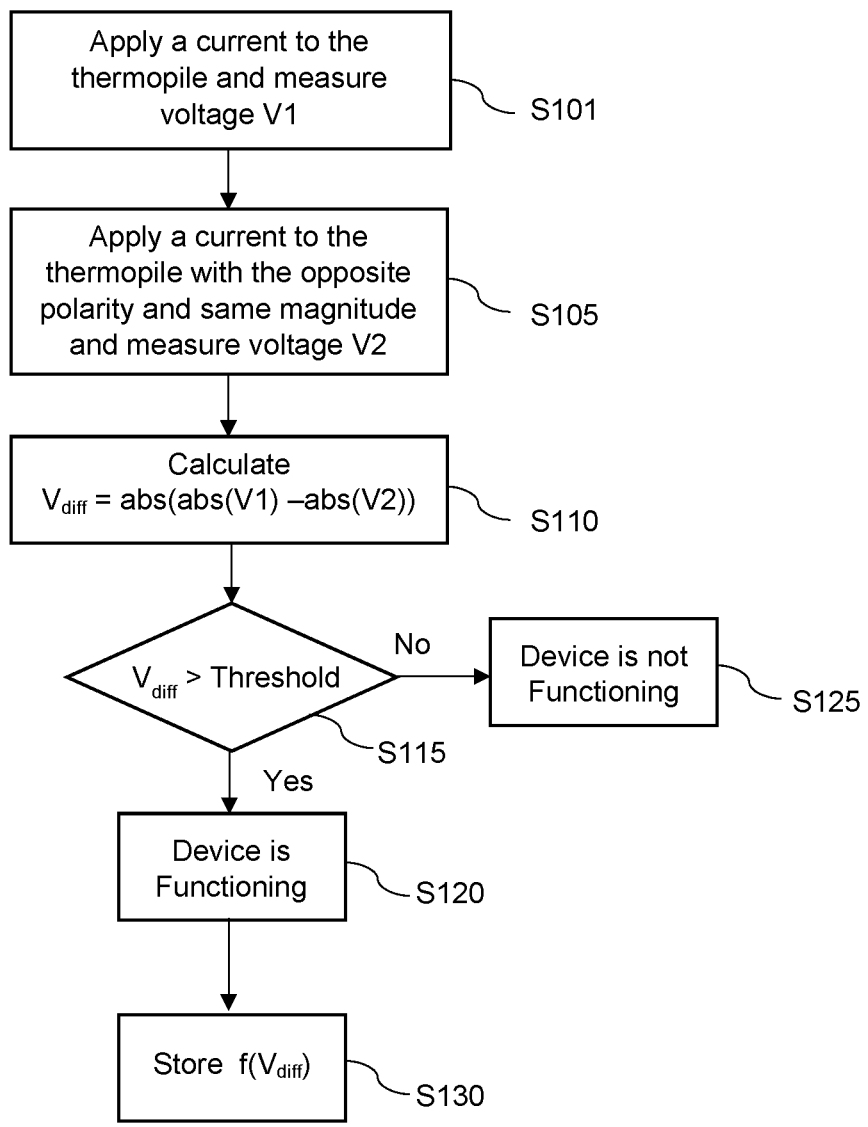
FIG. 2 illustrates a flow diagram outlining an alternative method to calibrate or test the functionality of a thermopile device in which the calibration value is only stored if the device is determined to be functioning.

FIG. 2 illustrates a flow diagram outlining an alternative method to calibrate or test the functionality of a thermopile detector according to a further embodiment of the disclosure. The steps of FIG. 2 are the same as those in FIG. 1, except that, in this embodiment, the calibration value is only stored (in S130) if $V_{diff}$>threshold value and the device is determined to be functioning.

It will be appreciated that other variations of this method are also possible. An alternative method according to a further embodiment may include applying a voltage in each direction, and measuring the current, and using the differences in current measured.

Furthermore, the current or voltage applied need not always be the same magnitude. Small differences, for example to keep the power constant, are possible. Also to determine the functionality of the thermopile, instead of using the difference in the electrical parameters measured, other mathematical functions can also be used.

Figure 3:
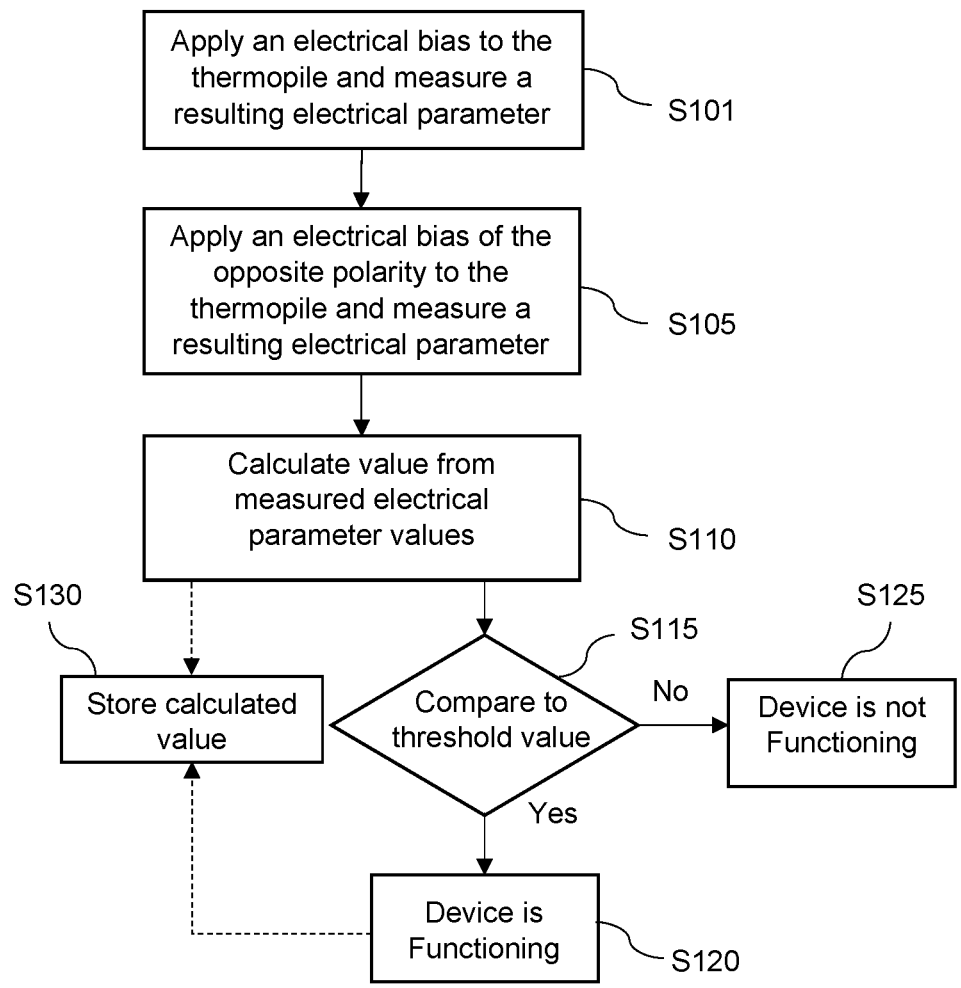
FIG. 3 illustrates a flow diagram outlining an alternative method to calibrate or test the functionality of a thermopile device in which any form of electrical bias may be applied to the thermopile.

FIG. 3 illustrates a flow diagram outlining a method to calibrate or test the functionality of a thermopile detector according to a further embodiment. In this embodiment any form of electrical bias may be applied to the thermopile. The steps are then as follows:

1. In S101, apply an electrical bias of a first polarity to the thermopile of the thermopile detector and measure a resulting electrical parameter
2. In S105, apply an electrical bias of a second polarity to the thermopile of the thermopile detector with the opposite polarity and measure a resulting electrical parameter
3. In S110, use the electrical parameter values measured in steps 1 and 2 to:
   a. In S115 determine if the device is functioning (S120) or not (S125); and/or
   b. In S130 store a value representing the calibration of the thermopile.

In this embodiment, the electrical bias of a first polarity and the electrical bias of a second polarity may be the same type of electrical bias or may be different types of electrical bias. Accordingly, the electrical parameter measured in S101 may be the same electrical parameter as measured in S105, or may be a different parameter.

For example, an alternative method according to a further embodiment may include applying a current in a first direction, and measuring the voltage (V1). The method then includes applying a voltage with the opposite polarity (V2) and measuring the current. In this embodiment V2 can be chosen to be the same as V1, or V2 and V1 can be chosen such that the power is the same in both polarities. It will be appreciated that other variations of this method are also possible.

The method may also include performing an additional measurement of an electrical parameter without applying an electrical bias on the thermopile, in order to measure the background signal on the thermopile.

The method can be applied during application to self-test or self-calibrate the thermopile. It can also be used during production to test the device during wafer level testing, or package level testing.

Figure 4:
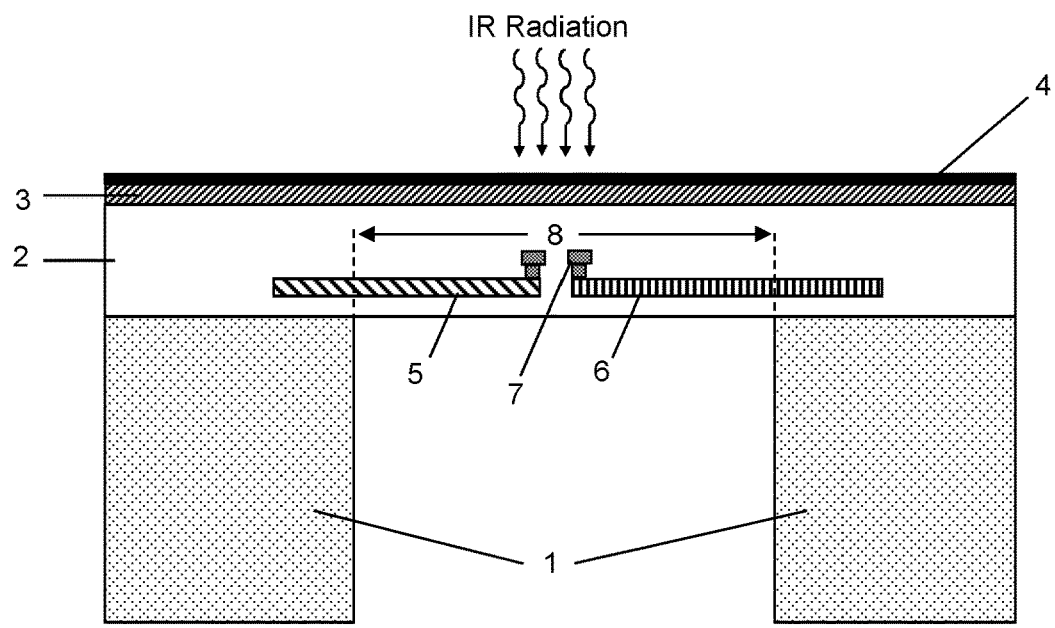
FIG. 4 shows an exemplary infrared detector.

FIG. 4 shows an exemplary infrared detector. It comprises a membrane layer 2, 3, supported by a silicon substrate 1 which has an etched portion. The membrane layer comprises a dielectric layer 2 and a passivation layer 3. The membrane layer 2, 3 has a membrane region 8. The membrane region 8 is located adjacent to the etched portion of the substrate 1. The membrane region 8 may be formed using front etching or back etching. The membrane region 8 corresponds to the region which is immediately above or below the cavity.

A thermopile is formed within the membrane layer comprising several thermocouples connected together in series. The thermopile is micromachined on a silicon chip. The thermocouples use N doped silicon 5 and P doped silicon 6 materials. A CMOS metal 7 is used to electrically connect the P+ and N+ layers in hot and cold thermal junctions. A metal layer (made within the CMOS process) is used to connect them to avoid a semiconductor P/N junction forming. A material with high IR absorption 4 is grown or deposited on the top of the membrane layer 2.

The thermopile used for testing can be of different types. The two thermocouple materials can also be a metal, and either P+ or N+ silicon. The thermopile can also be non-CMOS employing non-CMOS materials as the thermocouple materials, such as a metal or an alloy comprising Antimony, Bismuth, or a semiconductor such as Germanium, Silicon Germanium or Indium Gallium Arsenide. The thermopile can also be of a non-micromachined type.

Figure 5:
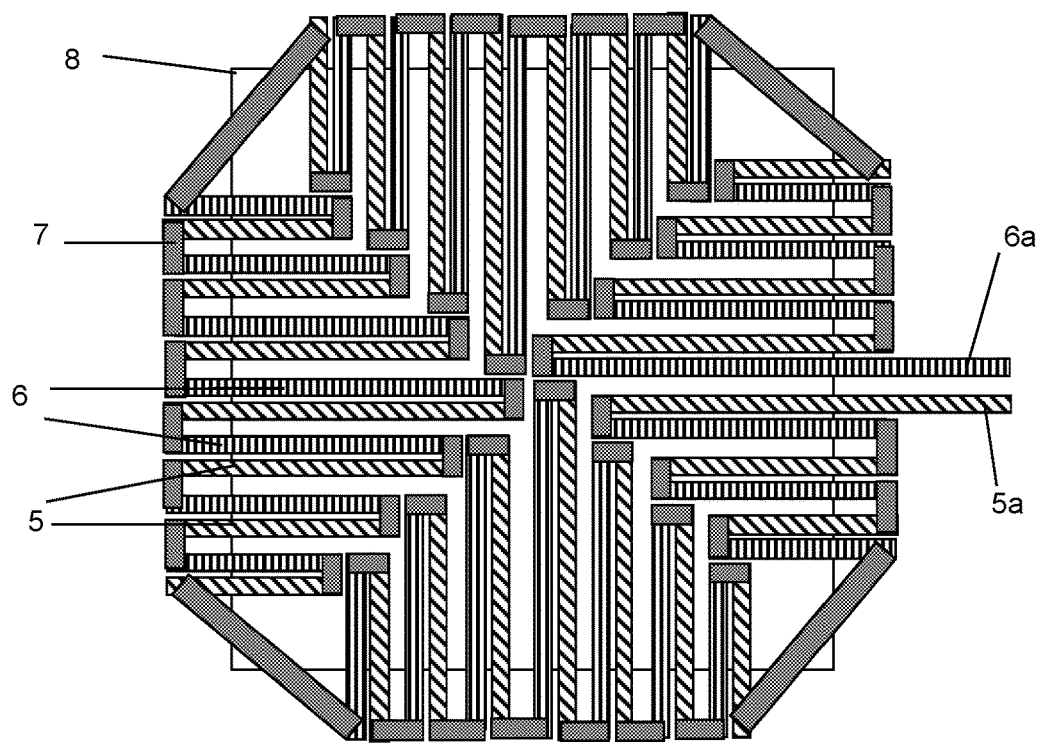
FIG. 5 shows a plan view of a thermopile on a rectangular membrane.

FIG. 5 shows a plan view of a thermopile on a rectangular membrane 8. The thermocouples are arranged so that the middle thermocouples go all the way to the centre of the membrane, while the subsequent thermocouples are further away from the centre as space in the centre fills up. The thermocouples comprise single crystal P+ silicon 5 and single crystal N+ silicon 6. Terminals 5*a* (single crystal N+ silicon) and 6*a* (single crystal P+ silicon), form the two end terminals of the thermopile.

Figure 6:
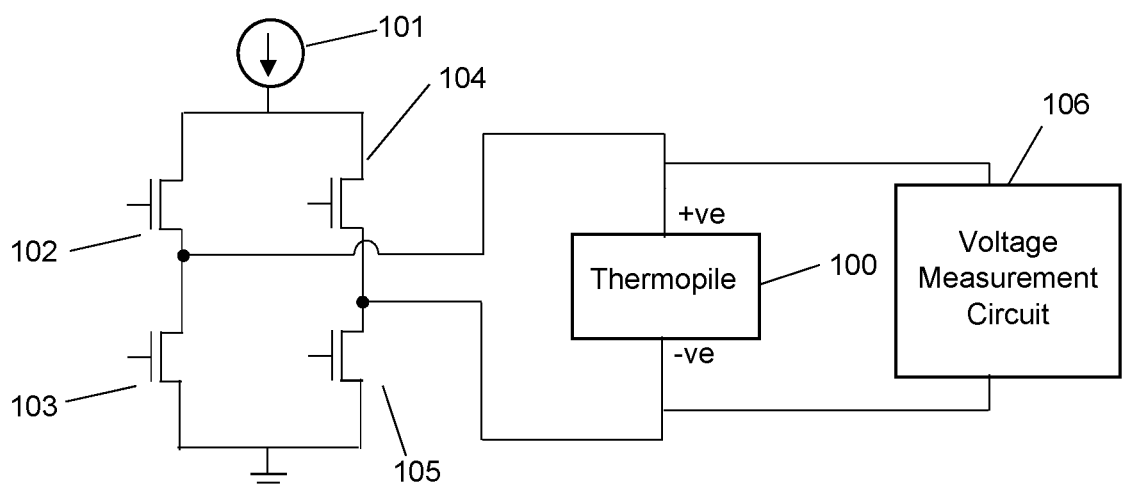
FIG. 6 shows an exemplary circuit for testing and/or calibrating a thermopile device.

FIG. 6 shows an exemplary circuit to drive the thermopile according to one embodiment of the disclosure. The thermopile 100 comprises a positive terminal and a negative terminal. Current is supplied by a current source 101. The polarity of the current supplied to the thermopile 100 is dependent on which of the transistors are turned on. When transistors 102 and 105 are turned on, and transistors 103 and 104 are turned off, then the current direction is from the positive terminal of the thermopile to the negative terminal. When the transistors 103 and 104 are turned on, and transistors 102 and 105 are turned off, then the current direction is from the negative terminal of the thermopile to the positive terminal. A voltage measurement circuit 106 is used to measure the voltage across the thermopile. The voltage measurement circuit 106 may include for example an Analogue to Digital convertor, which provides input to a circuit, or a microcontroller or microprocessor on the same chip, or external to the chip. It may also contain an amplifier or a filter.

An array of thermopiles may be tested. The array can comprised several thermopiles on the same chip, each thermopile with a separate membrane. Alternately, the array may have all the thermopiles on a single membrane.

Each thermopile in the array may be tested individually. Alternatively, the circuit may connect some or all the thermopiles in series and/or parallel and measure them simultaneously.

The circuit for testing the thermopiles and storing the calibration data can be on the same chip as the thermopile. Alternately it can be on a different chip, but within the same package as the thermopile. It can also be external to the thermopile package altogether.

Figure 7:
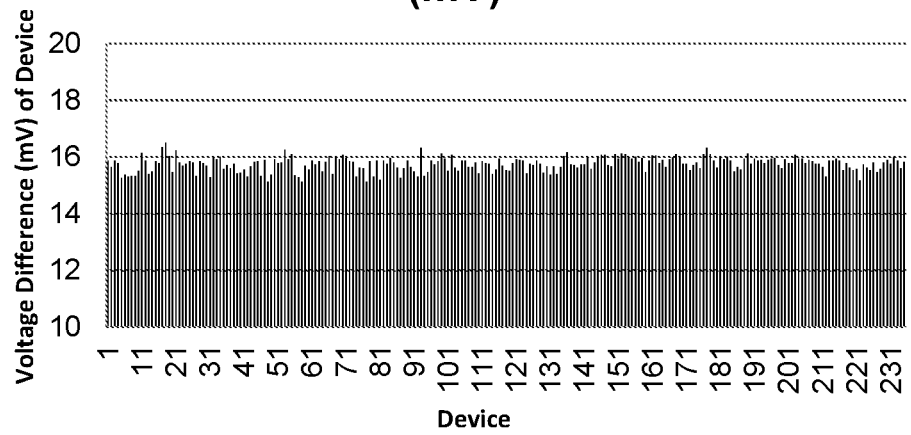
FIG. 7 shows absolute voltage difference results from initial tests done at package level on 235 devices.

FIG. 7 shows $V_{diff}$ results from initial tests done at package level on 235 devices. A current was applied with both polarities to the thermopiles, and the difference in absolute voltages was measured and plotted. The current applied can be in the range of about 1 nA-10 mA. This shows that a voltage difference, resulting from current of same magnitude but opposite polarities, can be detected.

Figure 8:
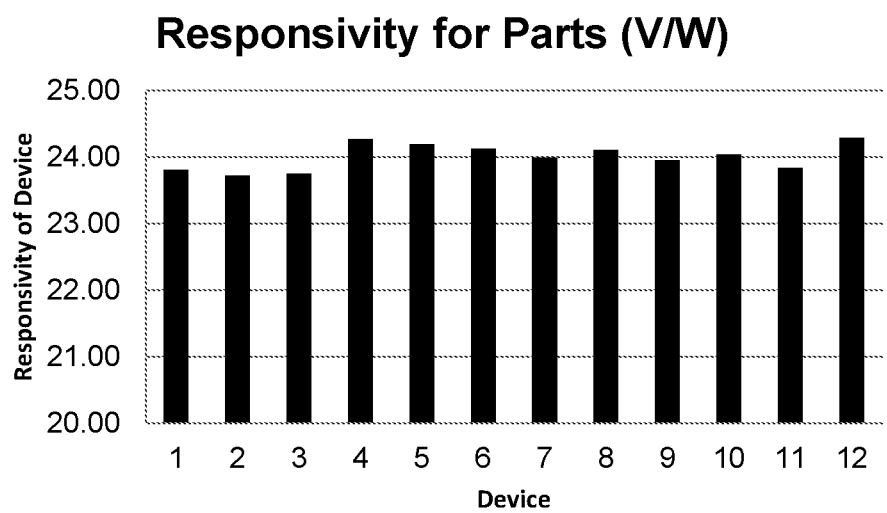
FIG. 8 shows sensitivities for a sample of similar devices tested in the lab.

FIG. 8 illustrates that for a sample of similar devices tested in the lab, all these devices had similar sensitivities.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A method for testing and/or calibrating a thermopile based device, the method comprising:
 applying an electrical bias of a first polarity to the thermopile based device and measuring a first value of an electrical parameter; and
 applying an electrical bias of a second polarity to the thermopile based device and measuring a second value of an electrical parameter;
 wherein said electrical bias of the first polarity and said electrical bias of the second polarity are applied to at least one thermopile, and wherein the first polarity and the second polarity are opposite polarities, and wherein the electrical bias of the first polarity and the electrical bias of the second polarity have a substantially equal magnitude;
 determining the magnitudes of the first value and the second value; and
 calculating a value of the absolute difference between the magnitude of the first value and the magnitude of the second value, wherein the absolute difference between the magnitude of the first value and the magnitude of the second value is based on the voltage generated in the thermopile due to heating after the voltage generated from the resistance of the material of the thermopile is cancelled out.

2. A method according to claim 1, further comprising using the first value and the second value to determine whether the device is functioning correctly.

3. A method according to claim 1, further comprising using the first value and the second value to determine a third value for calibration of the thermopile based device.

4. A method according to claim 1, further comprising determining whether the value of the absolute difference is greater than a predetermined threshold value.

5. A method according to claim 1, further comprising storing the value of the absolute difference, or a value calculated from the absolute difference.

6. A method according to claim 1, wherein said applying the electrical bias of the first polarity to the thermopile based device and applying the electrical bias of the second polarity to the thermopile based device comprise applying an electrical current to the thermopile based device; and
 wherein measuring the first value and measuring the second value comprise measuring the voltage across the thermopile based device.

7. A method according to claim 1, wherein said applying the electrical bias of the first polarity is achieved by directing a first current from a positive terminal to a negative terminal of the thermopile based device; and wherein said applying the electrical bias of the second polarity is achieved by directing a second current from the negative terminal to the positive terminal of the thermopile based device.

8. A method according to claim 1, further comprising electrically connecting at least two thermopile based devices and testing or calibrating the at least two thermopile based devices simultaneously.

9. A method according to claim 1, further comprising applying an electrical bias of zero magnitude to the thermopile based device and measuring a value of an electrical parameter, in addition to the first and second values, to determine the functionality of the device and/or the calibration of the device.

10. A system for testing and/or calibrating a thermopile based device, the system comprising:
   the thermopile based device;
   a first apparatus configured to apply an electrical bias of a first polarity to the thermopile based device and to apply an electrical bias of a second polarity to the thermopile based device, wherein said electrical bias of the first polarity and said electrical bias of the second polarity are applied to the thermopile based device, wherein the first polarity and second polarity are opposite polarities, and wherein the electrical bias of the first polarity and the electric bias of the second polarity have a substantially equal magnitude; and
   a second apparatus configured to measure an electrical parameter of the thermopile based device, wherein the second apparatus is further configured to:
      determine the magnitudes of the first value and the second value; and
      calculate a value of the absolute difference between the magnitude of the first value and the magnitude of the second value, wherein the absolute difference between the magnitude of the first value and the magnitude of the second value is based on the voltage generated in the thermopile due to heating after the voltage generated from the resistance of the material of the thermopile is cancelled out.

11. A system according to claim 10, wherein the second apparatus is configured to use the first value and the second value to determine whether the device is functioning correctly; and/or the second apparatus is configured to use the first value and the second value to determine a third value for calibration of the thermopile based device.

12. A system according to claim 10, wherein the first apparatus is configured to apply the electrical bias of the first polarity by directing a first current from a positive terminal to a negative terminal of the thermopile based device; and wherein the first apparatus is configured to apply the electrical bias of the second polarity by directing a second current from the negative terminal to the positive terminal of the thermopile based device.

13. A system according to claim 12, wherein the first apparatus comprises a plurality of transistors in which a first transistor and a fourth transistor are switched on to direct the first current from the positive terminal to the negative terminal of the thermopile based device, and a second transistor and a third transistor are switched on to direct the second current from the negative terminal to the positive terminal of the thermopile based device.

14. A system according to claim 10, wherein the thermopile based device and the first and second apparatus are formed on a single chip; or
   wherein the thermopile based device and the first and second apparatus are formed on separate chips within a single package.

15. A system according to claim 10, further comprising an array of thermopile based devices on a single chip, wherein each of the array of thermopile based devices are tested and/or calibrated individually.

16. A system according to claim 10, wherein the testing and/or calibration is performed at a wafer level or at a package level during production testing.

17. A system according to claim 16, further comprising a third apparatus configured to store a calibration value after the testing and/or calibration, wherein the third apparatus is formed on a same chip as a thermopile device; or wherein the third apparatus is formed on a separate chip within a same package as the thermopile device.

* * * * *